United States Patent
Makino et al.

(10) Patent No.: US 7,723,847 B2
(45) Date of Patent: May 25, 2010

(54) SEMICONDUCTOR DEVICE HAVING AN ELECTRODE PAD, A BUMP PROVIDED ABOVE THE ELECTRODE PAD AND A BUMP FOUNDATION LAYER THEREBETWEEN

(75) Inventors: Yutaka Makino, Kawasaki (JP); Tadahiro Okamoto, Kawasaki (JP); Takaki Kurita, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 120 days.

(21) Appl. No.: 11/703,153

(22) Filed: Feb. 7, 2007

(65) Prior Publication Data

US 2008/0012128 A1  Jan. 17, 2008

(30) Foreign Application Priority Data

Jul. 14, 2006 (JP) .............................. 2006-194852

(51) Int. Cl.
*H01L 23/498* (2006.01)
*H01L 21/60* (2006.01)

(52) U.S. Cl. .............................. 257/737; 257/E23.068; 257/778; 257/779; 257/775; 257/772; 257/765

(58) Field of Classification Search ................. 257/737, 257/E23.068, E21.508, 778, 779, 775, 772, 257/762, 765; 438/614
See application file for complete search history.

(56) References Cited

U.S. PATENT DOCUMENTS

| | | | | |
|---|---|---|---|---|
| 5,003,373 A | * | 3/1991 | Tsumura et al. | 257/771 |
| 6,638,847 B1 | | 10/2003 | Cheung et al. | |
| 6,767,411 B2 | * | 7/2004 | Yeh et al. | 148/24 |
| 6,861,344 B2 | * | 3/2005 | Yajima et al. | 438/612 |
| 7,141,878 B2 | * | 11/2006 | Homma | 257/738 |
| 2004/0177997 A1 | * | 9/2004 | Hata et al. | 174/257 |
| 2006/0043605 A1 | * | 3/2006 | Naka et al. | 257/779 |
| 2006/0060970 A1 | | 3/2006 | Jeong et al. | |
| 2006/0246706 A1 | * | 11/2006 | Ke et al. | 438/613 |
| 2007/0126030 A1 | * | 6/2007 | Ito | 257/211 |
| 2007/0200251 A1 | * | 8/2007 | Kim et al. | 257/778 |
| 2008/0044997 A1 | * | 2/2008 | Takewaki et al. | 438/614 |
| 2008/0083983 A1 | * | 4/2008 | Jang et al. | 257/737 |
| 2008/0099913 A1 | * | 5/2008 | Lehr et al. | 257/737 |
| 2008/0150161 A1 | * | 6/2008 | Lin et al. | 257/778 |
| 2008/0157362 A1 | * | 7/2008 | Chang et al. | 257/738 |

(Continued)

FOREIGN PATENT DOCUMENTS

CN  1320960 A  11/2001

(Continued)

OTHER PUBLICATIONS

Chinese Office Action dated Oct. 31, 2008, issued in corresponding Chinese Patent Application No. 200710084483.8.

*Primary Examiner*—Alexander O Williams
(74) *Attorney, Agent, or Firm*—Westerman, Hattori, Daniels & Adrian, LLP

(57) ABSTRACT

When a nickel (Ni) layer is formed on an electrode pad made of aluminum-silicon (Al—Si) by an electroless plating method, prior to the precipitation of zinc (Zn) which becomes a catalyst, copper (Cu) is formed in the form of discontinuous spots or islands on the surface of the electrode pad, thereby providing a copper (Cu) thin layer.

4 Claims, 11 Drawing Sheets

U.S. PATENT DOCUMENTS

| | | |
|---|---|---|
| 2009/0035893 A1* | 2/2009 | Nishiyama et al. ........... 438/121 |
| 2009/0163019 A1* | 6/2009 | Srivastava et al. ........... 438/612 |
| 2009/0174061 A1* | 7/2009 | Naka et al. .................. 257/698 |

FOREIGN PATENT DOCUMENTS

| | | | |
|---|---|---|---|
| JP | 4-133330 | * | 5/1992 |
| JP | 6-84919 | * | 3/1994 |
| JP | 2003-218152 A | | 7/2003 |

* cited by examiner

SHEAR TEST

GOOD SHEARING STATE

POOR SHEARING STATE

SEMICONDUCTOR DEVICE HAVING AN ELECTRODE PAD, A BUMP PROVIDED ABOVE THE ELECTRODE PAD AND A BUMP FOUNDATION LAYER THEREBETWEEN

CROSS-REFERENCE TO RELATED APPLICATIONS

This application is based upon and claims the benefit of priority from the prior Japanese Patent Application No. 2006-194852, filed on Jul. 14, 2006, the entire contents of which are incorporated herein by reference.

BACKGROUND OF THE INVENTION

1. Field of the Invention

The present invention relates to a semiconductor device constructed by providing a bump electrode above an electrode pad and a manufacturing method of the same.

2. Description of the Related Art

With a demand for miniaturization and higher performance of an electronic device, higher performance, higher integration, and higher-density mounting of a semiconductor device which is mounted on the electronic device are also demanded.

Therefore, as one way of satisfying the demand for higher-density mounting, so-called bare chip mounting is attracting attention as a mounting form of a semiconductor element (semiconductor chip).

In this bare chip mounting, as a way of connecting an electrode of a semiconductor element and an electrode wiring in a substrate on which the semiconductor element is mounted, so-called face down mounting (flip chip mounting), in which the semiconductor element is mounted on the substrate by providing a bump electrode on a principal surface of a semiconductor chip and connecting the bump electrode to the electrode of the substrate, tends to be used.

When a semiconductor device including the above bump electrode is manufactured, zinc (Zn) is precipitated on an electrode pad, for example, made of aluminum-silicon (Al—Si) by an electroless plating method, and then a nickel (Ni) layer is formed by the electroless plating method with the zinc (Zn) as a catalyst, thereby forming a bump foundation layer.

Subsequently, after a gold (Au) layer is formed so as to cover the nickel layer, the bump electrode is formed using solder or the like as a material on the nickel layer (for example, see Patent Document 1).

[Patent Document 1] Japanese Patent No. 3615206

However, if a conventionally used electrode pad (Si: 1 wt %) made of aluminum-silicon (Al—Si) is used as the electrode pad when the bump electrode is formed by the above conventional art, there is a large possibility that the adhesion of the bump electrode to the electrode pad is not sufficient, which causes detachment of the bump electrode.

Usually, in a so-called shear teat to test the adhesion strength of the bump electrode, as shown in FIG. 10A, the test is performed by bringing a shear tool 111 into contact with a bump electrode 105 formed above the surface of an electrode pad 103 with a foundation layer 104 made of nickel (Ni) therebetween, the electrode pad 103 being provided above a semiconductor substrate 101 with an insulating layer 102 therebetween.

Namely, the sharp-edged shear tool 111 is used, and by moving this shear tool 111 with respect to the bump electrode 105 in a direction parallel to the surface of the semiconductor substrate 101 and bringing it into contact with the bump electrode 105, lateral pressure is applied to the bump electrode 105.

Incidentally, in this figure, numeral 106 denotes a passivation layer made of silicon nitride, polyimide, or the like, and numeral 106a denotes an opening (window) formed in the passivation layer 106.

If the bump electrode 105 is firmly connected to the electrode pad 103, as shown in FIG. 10B, even where the shear tool 111 is brought into contact therewith, the bump electrode 105 is not detached from the electrode pad 103, and the bump electrode 105 stays without its portion of contact with the shear tool 111 being separated and removed.

However, when the adhesion between the electrode pad 103 and the bump electrode 105 is not sufficient, as shown in FIG. 10C, detachment occurs between the electrode pad 103 and the foundation layer 104 due to pressing force of the shear tool 111 to the bump electrode 105, and consequently the bump electrode 105 together with the foundation layer 104 is detached from the electrode pad 103.

As just described, the adhesion between the electrode pad 103 made of aluminum-silicon (Al—Si) and the foundation layer 104 is low, and therefore it is difficult to provide the bump electrode 105 with high adhesion to the electrode pad 103.

The inventor has found that one of the causes of contact between the electrode pad 103 and the foundation layer 104 without sufficient adhesion is the form of zinc (Zn), which acts as a catalyst in the above nickel plating, when it is formed on the electrode pad 103.

Namely, the zinc (Zn) which acts as the catalyst when the foundation layer 104 is formed has low adhesion to the electrode pad 103 made of aluminum-silicon (Al—Si) described above, and hence, as shown in FIG. 11A, a region where zinc (Zn) 107 does not exist occurs on the surface of the electrode pad 103.

The zinc (Zn) 107 is deposited by the electroless plating method such as a double zincate method using a bath containing the zinc, but it is difficult for the bath containing the zinc to come into uniform contact with the surface of the electrode pad 103, so that nonuniform density or one-sided distribution occurs in precipitation/deposition of the zinc (Zn).

This one-sided precipitation of the zinc (Zn) 107 also causes one-sided formation of the foundation layer 104 made of nickel (Ni), and as shown in FIG. 11B, a region S where the foundation layer 104 does not exist occurs on the surface of the electrode pad 103.

Due to the above occurrence of the region where the foundation layer 104 does not exist, as shown in FIG. 1C, the bump electrode 105 is formed across both the foundation layer 104 formed one-sidedly on the electrode pad 103 and a surface-exposed portion of the electrode pad 103, and thereby a portion where the bump electrode 105 comes into direct contact with the electrode pad 103 occurs.

In such a connection structure, not only the adhesion between the electrode pad 103 and the foundation layer 104 further deteriorates, but also a solder component contained in the bump electrode 105 is diffused into the electrode pad 103, which significantly impairs the reliability of the semiconductor device.

SUMMARY OF THE INVENTION

The present invention is made in view of the above problem, and its object is to provide a semiconductor device constructed by providing a bump electrode above an electrode pad mainly formed of aluminum (Al), for example, aluminum-silicon (Al—Si), with a nickel (Ni) foundation layer therebetween, in which the bump electrode can be provided with sufficient adhesion to the electrode pad, and a manufacturing method capable of forming the above structure with high reliability.

A semiconductor device of the present invention comprises: a semiconductor substrate; an electrode pad provided above one principal surface of the semiconductor substrate, using aluminum as its main material, and having a copper layer on its surface layer portion; a bump foundation layer provided on the electrode pad; and a bump provided above the electrode pad with the bump foundation layer therebetween.

A semiconductor device of the present invention comprises: a semiconductor substrate; an electrode pad provided on one principal surface of the semiconductor substrate, using aluminum as its main material, and containing in its surface layer portion copper whose concentration becomes lower in a thickness direction from the surface layer portion; a bump foundation layer provided on the electrode pad; and a bump provided above the electrode pad with the bump foundation layer therebetween.

A manufacturing method of a semiconductor device of the present invention comprises the steps of: forming an electrode pad with aluminum as its main material above one principal surface of a semiconductor substrate; forming a copper layer on a surface of the electrode pad; depositing zinc on the electrode pad on which the copper layer is formed; forming a bump foundation layer on the electrode pad with the zinc as a catalyst; and forming a bump on the bump foundation layer.

DETAILED DESCRIPTION OF THE PREFERRED EMBODIMENTS

Basic Gist of the Present Invention

Figure 1A:
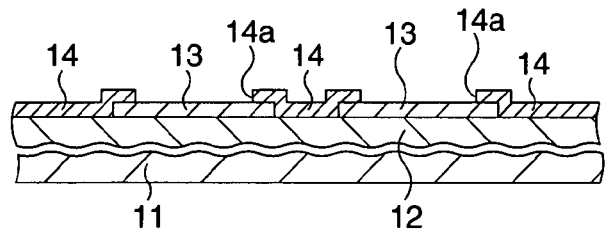
FIG. 1A to FIG. 1F are schematic sectional views showing a manufacturing method of a semiconductor device according to a first embodiment of the present invention.

The present inventor has studied a problem that when a foundation layer made of nickel (Ni) is formed on the surface of an electrode pad made of a material mainly composed of aluminum (Al), the plating deposition property of zinc (Zn) acting as a catalyst is low and besides the adhesion between the electrode pad and the foundation layer is low as described above.

As a result, the inventor has found that such a phenomenon is especially pronounced in an electrode pad made of an aluminum (Al) base alloy containing silicon (Si) such as aluminum-silicon (Al—Si), whereas it does not occur in an electrode pad made of an aluminum (Al) base alloy containing copper (Cu) (e.g. aluminum-copper-titanium (Al—Cu—Ti), aluminum-silicon-copper (Al—Si—Cu), or the like).

However, since the above material made of aluminum-silicon (Al—Si) is excellent in usability, it is rich in versatility as the material for the electrode pad, so that it is frequently used as the material for the electrode pad.

Hence, the present inventor has made a study in order that even in the case of the electrode pad made of aluminum-silicon (Al—Si), zinc (Zn) as a catalyst for forming a nickel (Ni) layer is precipitated uniformly on the surface of the electrode pad, and reached the present invention.

In the present invention, when zinc (Zn) is precipitated on the surface of an electrode pad made of a metallic material not containing copper such as aluminum-silicon (Al—Si), a copper (Cu) layer is previously provided on the surface of this electrode pad or copper (Cu) is made to be contained in the surface of the electrode pad, and in this state, zinc (Zn) is deposited/precipitated.

The nickel (Ni) layer is formed using this zinc (Zn) as a catalyst, and a bump electrode is formed on this nickel layer.

Here, by depositing the copper (Cu) layer on condition that its thickness is from about 1 nm to about 20 nm, this copper (Cu) is deposited in the form of spots or islands, thereby forming a discontinuous covering layer.

By providing copper (Cu) as the covering layer having the form of discontinuous spots or islands on the surface of the electrode pad, zinc (Zn) is precipitated at a high density on the surface of a boundary portion between the discontinuous covering layer of copper (Cu) and its surrounding surface-exposed portion of the electrode pad, and further zinc (Zn) is also precipitated on the exposed surface of the electrode pad between spot- or island-shaped portions of the copper (Cu) covering layer, although at a low density.

Consequently, a catalyst layer made of the dispersedly arranged zinc (Zn) containing the high-density portion is formed on the surface of the electrode pad.

Meanwhile, it is also possible that after the thin copper (Cu) layer is formed on the surface of the electrode as described above, copper (Cu) is diffused in the surface of the electrode pad by performing heat treatment.

In this case, the copper (Cu) is diffused as a diffusion region having the form of discontinuous spots or islands in the surface of the electrode pad and its concentration becomes lower in its thickness direction from the surface of the electrode pad.

By providing this copper diffusion region, on the surface of the electrode pad, zinc (Zn) is precipitated at a high density corresponding to the existence/form of the copper diffusion region.

Consequently, a catalyst layer made of the dispersedly arranged zinc (Zn) containing the high-density portion is formed on the surface of the electrode pad.

Further, it is also possible that after the copper (Cu) layer is formed with a thickness of about 50 nm on the surface of the electrode pad, copper (Cu) is diffused in the surface of the electrode pad by performing heat treatment.

In this case, the copper (Cu) is formed as a film which continuously covers the surface of the electrode pad.

As a result, the copper (Cu) is diffused while forming a continuous region at the surface of the electrode pad, and its concentration becomes lower in its thickness direction from the surface of the electrode pad.

By providing this copper diffusion region, it becomes possible to precipitate zinc (Zn) uniformly on the entire region of the surface of the electrode pad, which ensures high adhesion between the electrode pad and a foundation layer made of nickel (Ni).

Incidentally, according to this method, it is necessary to remove copper (Cu) remaining on the surface of the electrode pad after the heat treatment.

Various Preferred Embodiments to which the Present Invention is Applied

Various embodiments of the present invention will be described in detail below with reference to the drawings. In the following embodiments, a constitution of a semiconductor device will be described with a manufacturing method thereof.

First Embodiment

A manufacturing method of a semiconductor device in a first embodiment of the present invention will be shown in FIG. 1A to FIG. 1F, FIG. 2A to FIG. 2F, and FIG. 3A to FIG. 3C.

A semiconductor substrate on one principal surface of which plural semiconductor elements are formed is prepared. This semiconductor substrate is also called a semiconductor wafer and made of, for example, silicon (Si).

A so-called wafer process is applied to this semiconductor substrate, and on its one principal surface, plural semiconductor elements such as logic circuit elements or semiconductor memory elements each having an active element such as an MOS transistor, a passive element such as a capacitor element, and a wiring layer are formed.

In each semiconductor element region of the semiconductor substrate, an electrode pad for external connection is provided above the surface thereof with an insulating layer or a multilayer wiring layer therebetween.

After the formation of bump electrodes which will be described later, the semiconductor substrate is separated into individual semiconductor elements by dicing.

Incidentally, in this embodiment, a description and a graphic representation of constitutions of the active element, the passive element, and the wiring layer in the semiconductor element are omitted.

FIG. 1A shows a state where the electrode pads are provided on the semiconductor substrate.

Namely, electrode pads 13 are selectively provided on an insulating layer (or an insulating layer on a multilayer wiring layer) 12 covering a principal surface of a semiconductor substrate 11, and a passivation layer 14 made of a silicon nitride (SiN) layer, a polyimide layer, or the like is provided to selectively cover the insulating layer 12 and the electrode pads 13.

Incidentally, numeral 14a denotes an opening (window) formed on the electrode pad 13 and in the passivation layer 14.

The above structure is achieved by forming the insulating layer (or the insulating layer on the multilayer wiring layer) 12 made of silicon oxide (SiO) or the like on one principal surface of the semiconductor substrate 11 on the one principal surface of which an active element such as an MOS transistor, a passive element such as a capacitor element, and a wiring layer are formed by a vapor growth method or the like and thereafter forming an aluminum (Al) alloy layer containing silicon (Si) with a thickness of about 1 μm on the insulating layer 12 by a sputtering method or the like.

Then, this aluminum (Al) alloy layer containing silicon (Si) is patterned to form plural electrodes pads 13 together with wirings (not shown).

Subsequently, the passivation layer 14 made of silicon nitride (SiN) is deposited with a thickness of about 1 μm so as to cover the electrode pad 13.

As a growth method of the passivation layer 14, a normal vapor growth method can be used.

As a material for the passivation layer 14, polyimide or the like can also be used.

Then, using a photo-etching process, the passivation layer 14 is patterned to form the opening 14a from which the surface of the electrode pad 13 is exposed.

Subsequently, a copper (Cu) layer 15 is deposited/formed on the exposed surface of the electrode pad 13 and the passivation layer 14 (see FIG. 1B).

Namely, using the sputtering method, a vapor deposition method, or the like, copper (Cu) is deposited with a thickness of about 1 nm to about 20 nm on the passivation layer 14 and the electrode pad 13 exposed in its opening 14a, thereby forming the copper (Cu) layer 15.

Figure 1B:
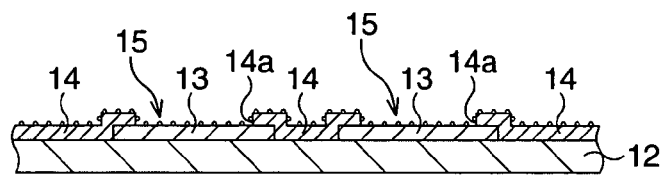
Figure 3A:
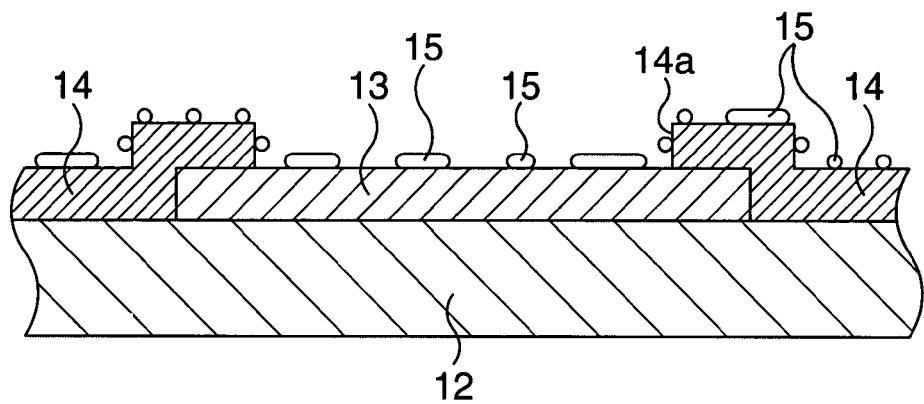
FIG. 3A to FIG. 3C are schematic sectional views showing specific steps of the manufacturing method of the semiconductor device according to the first embodiment in an enlarged form.

At this time, as shown in FIG. 3A, the copper (Cu) layer 15 is deposited in the form of discontinuous spots or islands (FIG. 3A shows the electrode pad 13 portion shown in FIG. 1B in an enlarged form).

Figure 1C:
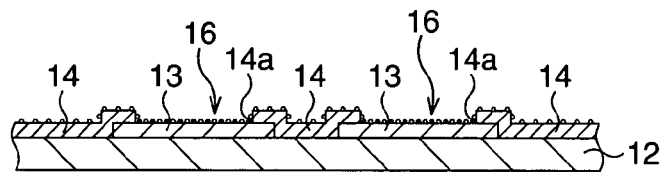
Figure 1D:
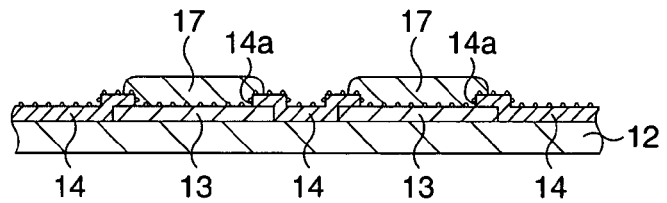
Figure 1E:
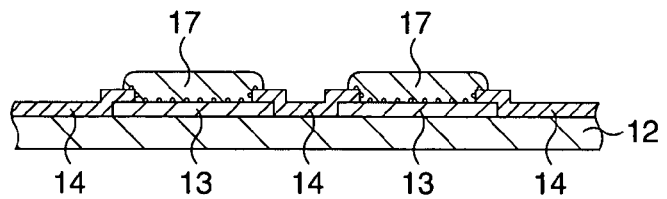
Figure 1F:
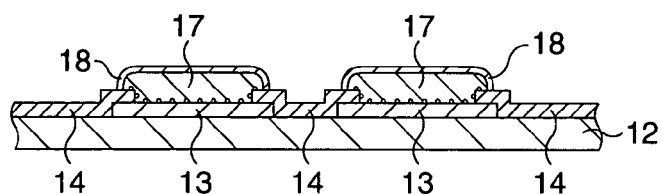
Figure 2A:
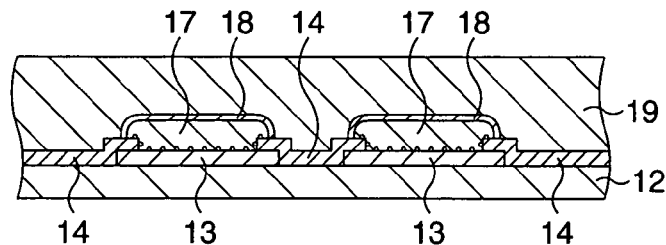
FIG. 2A to FIG. 2F are schematic sectional views showing the manufacturing method of the semiconductor device according to the first embodiment of the present invention.
Figure 2B:
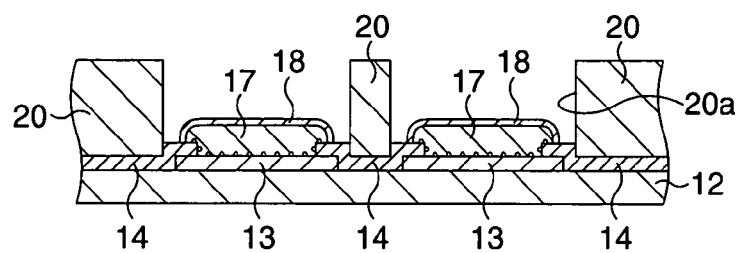
Figure 2C:
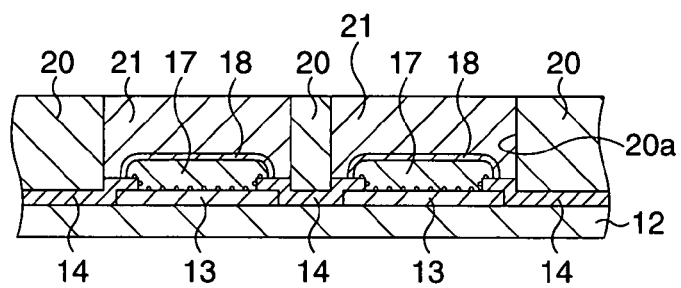
Figure 2D:
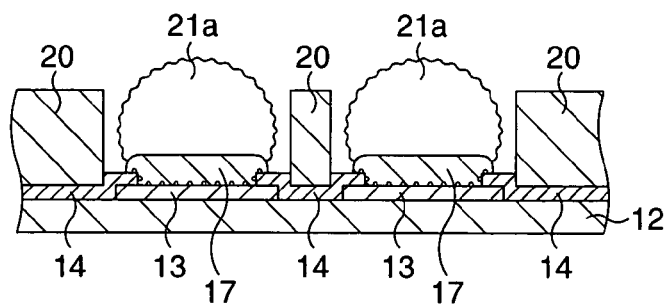
Figure 2E:
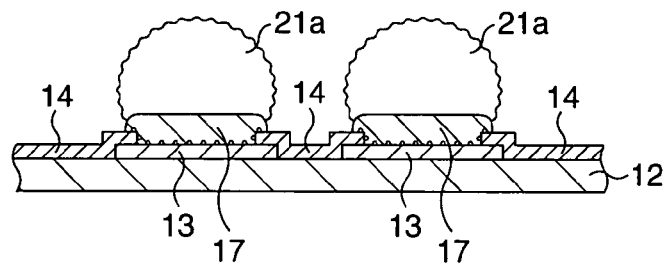
Figure 2F:
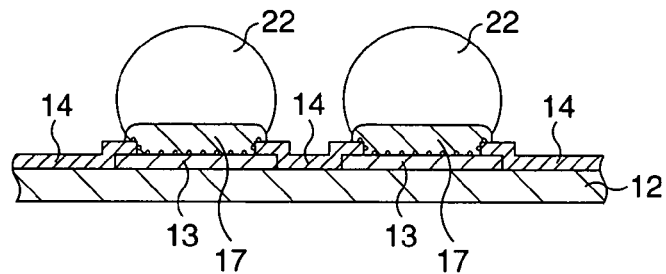
Figure 3B:
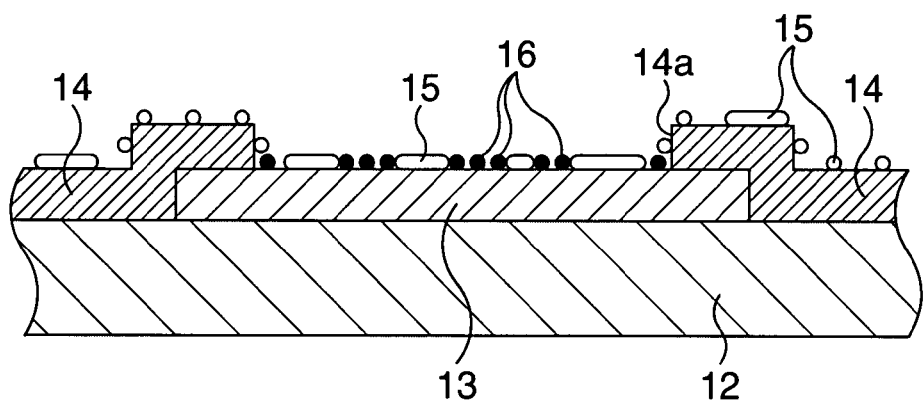
Figure 3C:
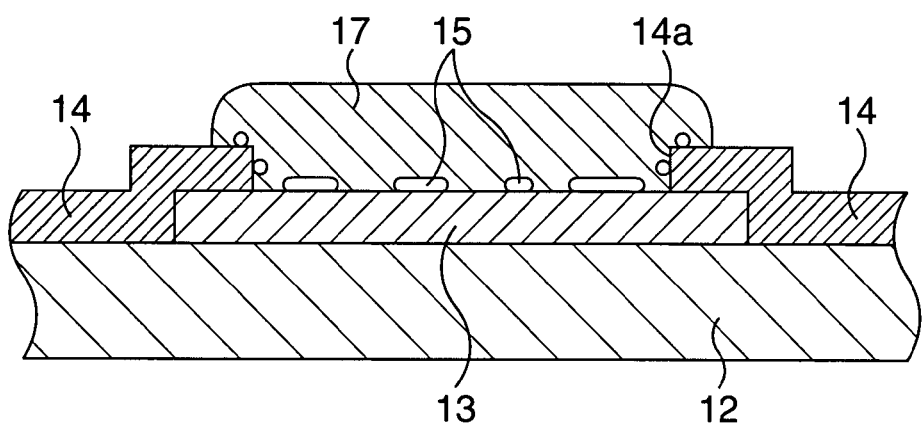

Incidentally, in FIG. 1C to FIG. 1F and FIG. 2A to FIG. 2F in addition to FIG. 1B, the copper (Cu) layer 15 is shown to have a uniform distribution, but the copper (Cu) layer 15 is formed in the form of discontinuous spots or islands as shown in FIG. 3A to FIG. 3C.

In this embodiment, in and after FIG. 1B, the semiconductor substrate 11 portion is not shown.

Then, zinc (Zn) is deposited on the surface of the electrode pad 13 thereby forming a zinc (Zn) layer 16 (see FIG. 1C).

The zinc (Zn) layer 16 is formed by using a double zincate method with a plating bath containing zinc (Zn) and immersing the semiconductor substrate 11 in the electroless plating bath.

At this time, the zinc (Zn) layer 16 is deposited/formed on the surface of the electrode pad 13 exposed in the opening 14a of the passivation layer 14 and having the copper (Cu) layer 15 on its surface.

The zinc (Zn) layer 16 acts as a catalyst in electroless plating of nickel (Ni) described later.

In this electroless plating of zinc (Zn), copper (Cu) constituting the copper (Cu) layer 15 has a smaller ionization tendency than aluminum (Al) and zinc (Zn) and hence remains on the surface of the electrode pad 13 without being ionized.

The copper (Cu) layer 15 exists on the surface of the electrode pad 13 in the form of discontinuous spots or islands as described above.

Therefore, as shown in FIG. 3B, the deposited zinc (Zn) is precipitated on the surface of the electrode pad 13 in regions where the copper (Cu) layer 15 does not exist (FIG. 3B shows the electrode pad 13 portion shown in FIG. 1C in an enlarged form).

As just described, in this embodiment, the copper (Cu) layer 15 exists in the form of discontinuous spots or islands on the surface of the electrode pad 13, so that the zinc (Zn) layer 16 is formed in a dispersed state on the surface of the electrode pad 13.

Namely, on the surface of the electrode pad 13, copper (Cu) is provided as the covering layer 15 having the form of discontinuous spots or islands, zinc (Zn) is precipitated at a high density on a boundary portion between the copper (Cu) layer 15 and its surrounding surface of the electrode pad 13, and further zinc (Zn) is also precipitated on the exposed surface of the electrode pad 13 between spot- or island-shaped portions of the copper (Cu) layer 15, although at a low density.

Consequently, a catalyst layer made of the dispersedly arranged zinc (Zn) layer 16 is provided on the surface of the electrode pad 13.

Then, a nickel (Ni) layer 17 is formed on the electrode pad 13 by an electroless plating method using the zinc (Zn) layer 16 as a catalyst (see FIG. 1D).

The plating of nickel (Ni) is performed by using an electroless plating bath containing phosphorus (P) and boron (B) together with this nickel (Ni) and immersing the semiconductor substrate 11 in the plating bath.

In this electroless plating, the zinc (Zn) layer 16 acts as a catalyst, and nickel (Ni) is precipitated on the surface of the electrode pad 13 exposed in the opening 14a of the passivation layer 14, threrby forming the nickel (Ni) layer 17.

Namely, nickel (Ni) is substituted for zinc (Zn) as the catalyst and precipitated to thereby form the nickel (Ni) layer 17.

At this time, the nickel (Ni) is precipitated after substituted for zinc (Zn) deposited on the electrode pad portion exposed in gaps of the copper (Cu) layer 15 deposited in the form of spots or islands, whereas the nickel (Ni) is not precipitated on the copper (Cu) layer 15 where zinc (Zn) layer 16 does not exist.

Then, with the growth of the nickel (Ni) layer 17, the copper (Cu) layer 15 on the surface of the electrode pad 13 is covered with the nickel (Ni) layer 17.

As a result, the nickel (Ni) layer 17 is provided on the surface of the electrode pad 13 exposed in the opening 14a of the passivation layer 14 with the copper (Cu) layer 15 deposited in the form of discontinuous spots or islands therebetween.

According to such a constitution, owing to the existence of the copper (Cu) layer 15, the nickel (Ni) layer 17 is provided with high adhesion to the surface of the electrode pad 13.

The nickel (Ni) layer 17 constitutes a foundation layer which functions as a barrier metal against a solder component of the bump electrode, and as its thickness, a thickness equal to or thicker than a thickness capable of preventing the solder component from being diffused into the electrode pad 13, for example, a thickness of 3 μm to 10 μm is selected.

Incidentally, here a case where with the formation of the nickel (Ni) layer 17, the zinc (Zn) layer 16 disappears from the top of the electrode pad 13 is shown, but the zinc (Zn) layer 16 may remain on the electrode pad 13 while significantly being thinned without disappearing.

Then, unnecessary portions of the copper (Cu) layer 15 are removed.

Namely, the copper (Cu) layer 15 remaining around the nickel (Ni) layer 17 on the passivation layer 14 is removed by a wet etching method (see FIG. 1E).

This wet etching is performed by immersing the semiconductor substrate 11 in an etching solution, for example, containing a hydrogen peroxide solution as a main component.

As a result, as shown in FIG. 3C, a constitution in which the nickel (Ni) layer 17 is provided via the copper (Cu) covering layer 15 formed on the surface of the electrode pad 13 exposed in the opening 14a is obtained (FIG. 3C shows the electrode pad 13 portion in FIG. 1E in an enlarged form).

Then, a gold (Au) layer 18 is formed so as to cover the nickel (Ni) layer 17 (see FIG. 1F).

The gold (Au) layer 18 is provided for the purpose of preventing surface oxidation of the nickel (Ni) layer 17 and improving solder wettability of the bump electrode formed in subsequent steps, and its thickness is a thickness capable of satisfying solder wettability, for example, a thickness of about 30 nm to 70 nm.

By a substitutional electroless plating method using a plating bath containing gold (Au), the gold (Au) layer 18 is formed by immersing the semiconductor substrate 11 in the plating bath.

Thereby, gold (Au) is precipitated on the surface of the nickel (Ni) layer 17 to cover the surface of the nickel (Ni) layer 17, thereby forming the gold (Au) layer 18.

Then, a photoresist layer 19 with a thickness of about 30 μm is formed above the semiconductor substrate to cover the nickel (Ni) layer 17 which is covered with the gold layer 18 and so on (see FIG. 2A).

Subsequently, the photoresist layer 19 is fabricated using a photo process, thereby forming a resist mask layer 20 (see FIG. 2B).

Namely, the resist mask layer 20 having an opening 20a from which the nickel (Ni) layer 17 covered with the gold (Au) layer 18 and its surroundings are exposed is formed on the surface.

Then, a solder paste 21 is filled into the opening 20a of the resist mask layer 20 (see FIG. 2C).

When the solder paste 21 is filled, it is desirable that the solder paste not remain on the upper surface of the resist mask 20.

Therefore, using a squeegee (not shown), not only the solder paste is filled into the opening 20a, but also the solder paste applied on the resist mask 20 is scraped off.

In order to certainly fill a predetermined amount of solder paste 21 into the opening 20a, such squeezing, in short, is performed plural times.

As the solder paste 21, what is obtained by adding/mixing solder powder to/with a flux composition made of rosin, a solvent, an activator, or the like can be used.

As a material constituting the solder powder, an alloy of plural kinds of metals selected from tin (Sn), lead (Pb), copper (Cu), silver (Ag), indium (In), zinc (Zn), bismuth (Bi), antimony (Sb), gold (Au), and so on is used.

Then, the solder paste 21 is subjected to reflowing.

Here, the reflowing is performed for the purpose of the tight adhesion/integration of the solder paste 21 to/with the nickel (Ni) layer 17. This reflowing is performed in a nitrogen atmosphere at a predetermined temperature equal to or higher than the melting point of solder.

Incidentally, if reflowing is performed again in a post process, heating for obtaining predetermined bump electrode shape and surface state is not necessarily required.

As a result of this reflowing, the solder paste 21 turns into a nearly spherical body 21a, and gold constituting the gold (Au) layer 18 is diffused into the solder paste 21a (see FIG. 2D).

Then, the resist mask layer 20 is removed (see FIG. 2E).

A solvent and a removal condition required to remove the resist mask layer 20 are selected appropriately depending on the kind of the resist material constituting the resist mask layer 20.

Subsequently, the solder paste 21 is subjected again to reflowing (see FIG. 2F).

This reflowing is also performed in the nitrogen atmosphere at a temperature equal to or higher than the melting point of solder.

By being melted again as described above, the nearly spherical solder paste 21a is adjusted to have a desired bump shape and a smooth surface state, and tightly adheres to and is integrated with the nickel (Ni) layer 17, thereby forming a bump electrode 22.

As a result of the above steps, a semiconductor device constructed by providing the nickel (Ni) layer 17 on the electrode pad 13 exposed from the opening 14a with the copper (Cu) layer 15 therebetween and providing the bump electrode 22 on the nickel (Ni) layer 17 is formed.

In this embodiment, on the surface of the electrode pad 13 exposed in the opening 14a of the passivation layer 14, the zinc (Zn) layer 16 is deposited with the copper (Cu) layer deposited in the form of discontinuous spots or islands therebetween, and further the nickel (Ni) layer 17 is provided with the zinc (Zn) layer 16 as the catalyst.

According to this constitution, on the surface of the electrode pad 13, in the state where the copper (Cu) layer 15 is selectively provided, the zinc (Zn) layer 16 is precipitated/formed, the nickel (Ni) layer 17 substituting for the zinc (Zn) layer 16 and having a nearly uniform thickness is provided, and the bump electrode 22 is formed on this nickel (Ni) layer 17.

As just described, the bump electrode 22 is provided above the electrode pad 13 with the nickel (Ni) layer 17 formed with the nearly uniform thickness therebetween, which certainly prevents the solder component constituting the bump electrode 22 from being diffused into the electrode pad 13.

Moreover, owing to the existence of the copper (Cu) layer 15 deposited in the form of discontinuous spots or islands, the adhesion of the nickel (Ni) layer 17 to the electrode pad 13 significantly improves. Consequently, the bump electrode 22 is formed with strong adhesion to the electrode pad 13, and high reliability is ensured.

As described above, according to this embodiment, when, using the electrode pad made of aluminum-silicon (Al—Si) or the like, the bump electrode is provided thereon, the copper (Cu) layer deposited in the form of discontinuous spots or islands is provided on the electrode pad, which makes it possible to ensure the sufficient adhesion of the bump electrode and obtain the bump electrode stably connected to the electrode pad, thereby enabling the realization of a highly reliable semiconductor device.

Second Embodiment

A second embodiment of the present invention will be described below.

Similarly to the above first embodiment, this embodiment discloses a semiconductor device constructed by connecting the electrode pad and the bump electrode via the nickel (Ni) layer and a manufacturing method thereof, but differs from the above first embodiment in that a copper (Cu) thermal diffusion step is added.

The manufacturing method of the semiconductor device in the second embodiment will be shown in FIG. 4A to FIG. 4G, FIG. 5A to FIG. 5F, and FIG. 6A to FIG. 6C.

Incidentally, the same numerals and symbols will be used to designate components corresponding to those in the above first embodiment, and a detailed description of the same steps will be omitted.

Figure 4A:
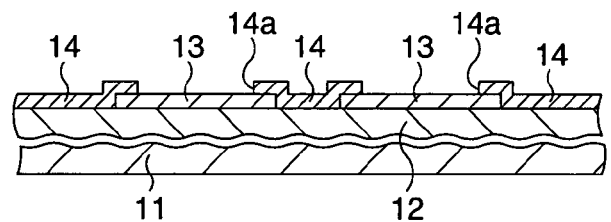
FIG. 4A to FIG. 4G are schematic sectional views showing a manufacturing method of a semiconductor device according to a second embodiment of the present invention.
Figure 4B:
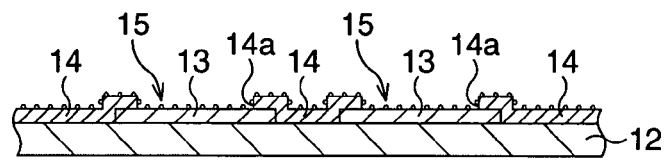

First, in steps shown in FIG. 4A and FIG. 4B, the same steps as shown in FIG. 1A and FIG. 1B in the above first embodiment are performed.

Incidentally, in this embodiment, in and after FIG. 4B, a graphic representation of the semiconductor substrate 11 is omitted.

Figure 4C:
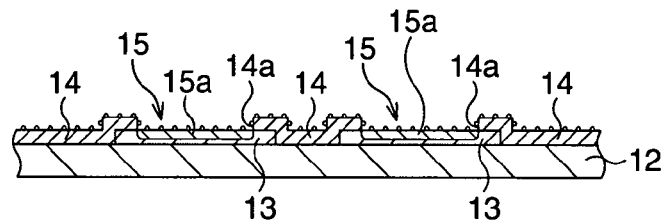

The semiconductor substrate 11 is heat-treated in the state where the copper (Cu) thin layer 15 is formed in the form of discontinuous spots or islands on the surface of the electrode pad 13 exposed in the opening 14a of the passivation layer 14 in the above steps (see FIG. 4C).

This heat treatment is performed under conditions of, for example, 300° C. and three minutes in a vacuum atmosphere.

Figure 6A:
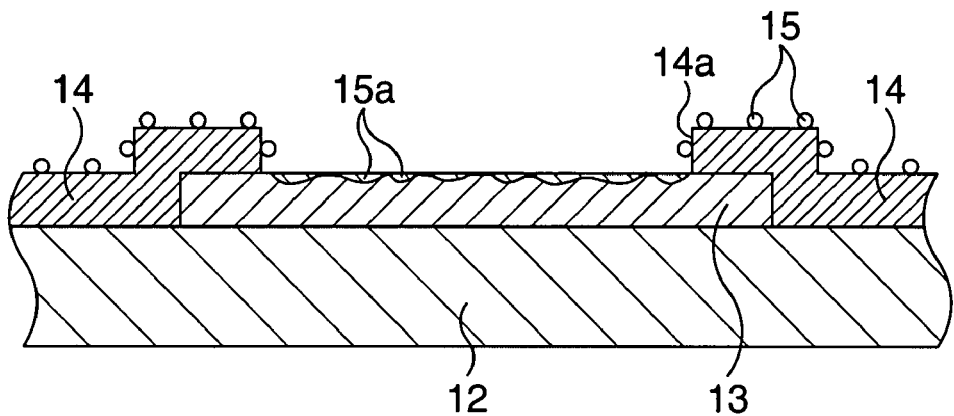
FIG. 6A to FIG. 6C are schematic sectional views showing specific steps of the manufacturing method of the semiconductor device according to the second embodiment in an enlarged form.

As a result of this heat treatment, as shown in FIG. 6A, copper (Cu) constituting the copper (Cu) layer 15 is thermally diffused in the surface layer portion of the electrode pad 13, and a copper (Cu) diffusion region 15a having a concentration ingredient in which the concentration becomes lower as the depth becomes deeper from the surface thereof is formed in the electrode pad 13 (FIG. 6A shows the electrode pad 13 portion in FIG. 4C in an enlarged form).

The copper (Cu) diffusion region 15a is formed in a dispersed state in the form of discontinuous spots or islands as described above in the surface portion of the electrode pad 13.

Moreover, the copper (Cu) diffusion region 15a has a concentration distribution in which the concentration decreases gradually in a thickness direction of the electrode pad 13 from the surface of the electrode pad 13.

Figure 6B:
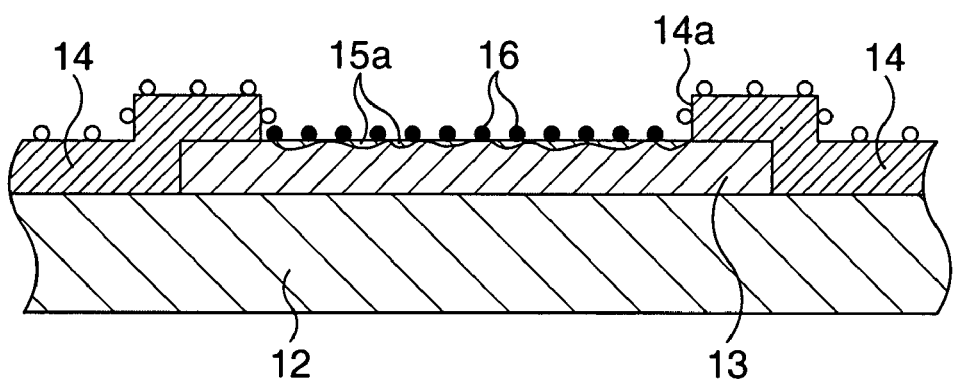
Figure 6C:
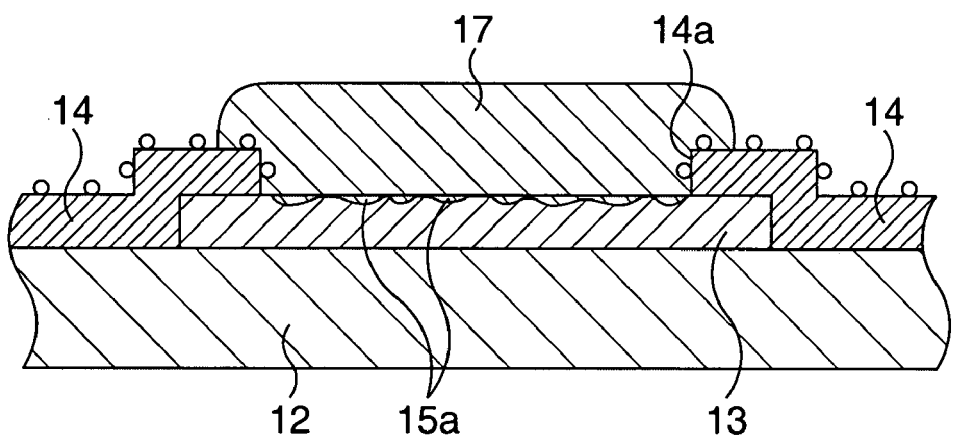

Incidentally, in FIG. 4D to FIG. 4G and FIG. 5A to FIG. 5G in addition to FIG. 4C, the copper (Cu) diffusion region 15a is shown as one region having a uniform depth, but the copper (Cu) diffusion region 15a corresponds to the deposition state of the copper (Cu) thin layer 15, and as shown in FIG. 6A to FIG. 6C, it is formed to be isolated or continuous in the form of islands and has a concentration which varies in a depth direction.

Figure 4D:
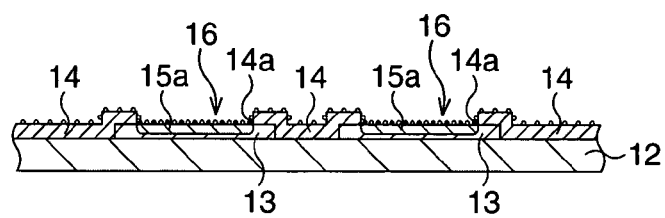

Then, zinc (Zn) is precipitated on the surface of the electrode pad 13, thereby forming the zinc (Zn) layer 16 (see FIG. 4D).

As described above, by using the double zincate method with the plating bath containing zinc (Zn) and immersing the semiconductor substrate 11 in the electroless plating bath, the zinc (Zn) layer 16 is deposited/formed on the surface of the electrode pad 13 exposed in the opening 14a of the passivation layer 14 and having the copper (Cu) diffusion region 15a at its surface.

The zinc (Zn) layer 16 acts as a catalyst in electroless plating of nickel (Ni) described later.

In this embodiment, the copper (Cu) diffusion region 15a is formed in the surface layer of the electrode pad 13, and a layer of copper (Cu) alone does not exist.

Accordingly, on the surface of the electrode pad 13 exposed in the opening 14a, zinc (Zn) is precipitated at a high density on the copper (Cu) diffusion region 15a, and between spot- or island-shaped portions of the copper diffusion region 15a, the zinc (Zn) layer 16 is formed while being precipitated at a low density (FIG. 6B shows the electrode pad 13 portion shown in FIG. 4D in an enlarged form).

Figure 4E:
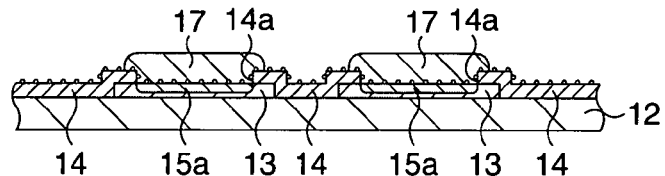
Figure 4F:
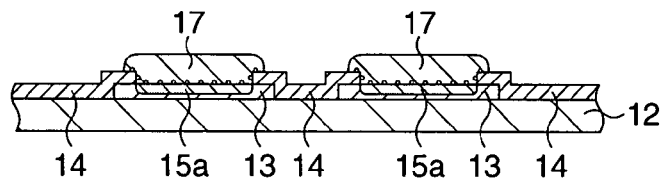
Figure 4G:
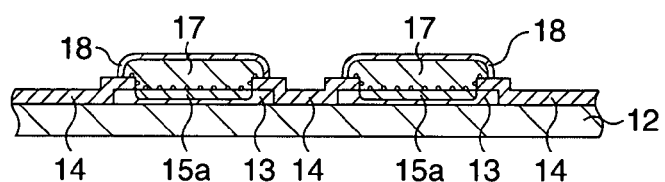
Figure 5A:
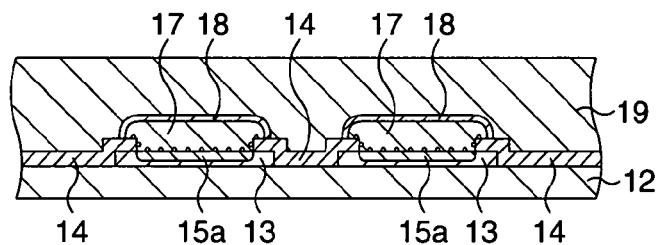
FIG. 5A and FIG. 5F are schematic sectional views showing the manufacturing method of the semiconductor device according to the second embodiment of the present invention.
Figure 5B:
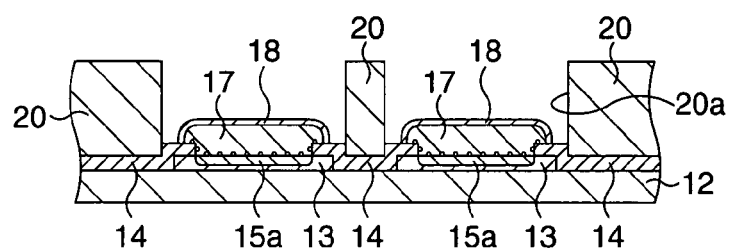
Figure 5C:
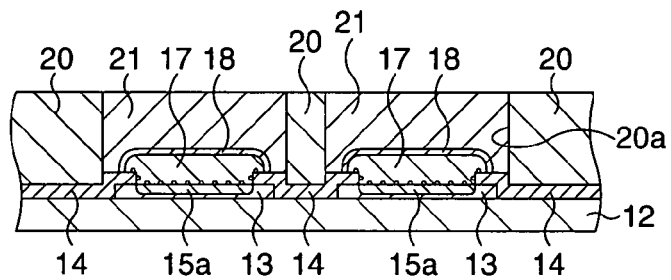
Figure 5D:
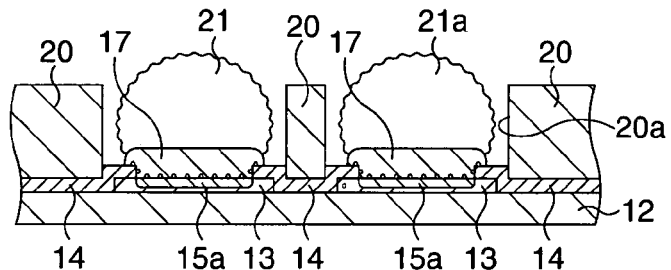
Figure 5E:
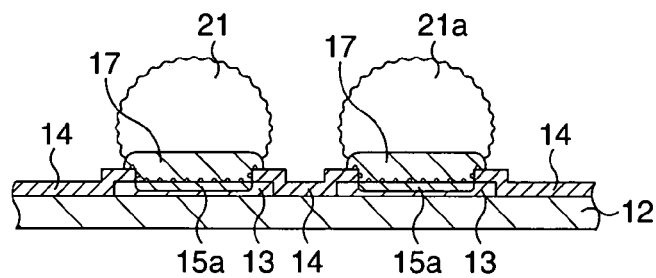
Figure 5F:
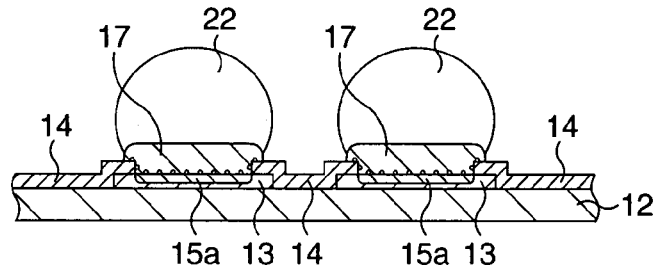

Then, the nickel (Ni) layer 17 is formed on the electrode pad 13 by the electroless plating method using the zinc (Zn) layer 16 as the catalyst (see FIG. 4E)

The plating of nickel (Ni) is performed by using the electroless plating bath containing phosphorus (P) and boron (B)

together with this nickel (Ni) and immersing the semiconductor substrate 11 in the plating bath.

In this electroless plating, the zinc (Zn) layer 16 acts as a catalyst, and nickel (Ni) is precipitated on the surface of the electrode pad 13 exposed in the opening 14a of the passivation layer 14, thereby forming the nickel (Ni) layer 17.

Namely, nickel (Ni) is substituted for zinc (Zn) as the catalyst and precipitated to thereby form the nickel (Ni) layer 17.

As a result, as shown in FIG. 6C, on the surface of the electrode pad 13 exposed in the opening 14a, the nickel (Ni) layer 17 is formed (FIG. 6C shows the electrode pad 13 portion shown in FIG. 4E in an enlarged form).

In this embodiment, a sufficient amount of zinc (Zn) is deposited on the electrode pad 13 without copper (Cu) alone existing on the surface of the electrode pad 13, and hence the adhesion of the nickel (Ni) layer 17 substituted for the zinc (Zn) and deposited to the electrode pad 13 is sufficiently high.

The nickel (Ni) layer 17 constitutes a foundation layer which functions as a barrier metal against the solder component of the bump electrode 22 described later, and its thickness is a thickness equal to or thicker than a thickness capable of preventing the solder component from being diffused into the electrode pad 13, for example, a thickness of 3 μm to 10 μm.

Incidentally, also here a case where with the formation of the nickel (Ni) layer 17, the zinc (Zn) layer 16 disappears from the top of the electrode pad 13 is shown, but the zinc (Zn) layer 16 may remain on the electrode pad 13 while significantly being thinned without disappearing.

Then, as shown in FIG. 4F and FIG. 4G and FIG. 5A to FIG. 5F, the same steps as shown in FIG. 1E and FIG. 1F and FIG. 2A to FIG. 2F in the above first embodiment are performed sequentially, and a semiconductor device is formed by providing the nickel (Ni) layer 17 on the electrode pad 13 in the state where the copper (Cu) diffusion region 15a is formed in the surface layer of the electrode pad 13 exposed from the opening 14a and providing the bump electrode 22 on the nickel (Ni) layer 17.

In this embodiment, after the copper (Cu) diffusion region 15a is formed in the form of discontinuous spots or islands in the surface layer portion of the electrode pad 13 exposed from the opening 14a, the zinc (Zn) layer is deposited on the electrode pad 13, and the nickel (Ni) layer 17 is formed with this zinc (Zn) layer as the catalyst.

According to this constitution, on the surface portion of the electrode pad 13, zinc (Zn) is precipitated corresponding to the diffusion state of the copper (Cu) thin layer 15, thereby forming the zinc (Zn) layer 16. Then, the nickel (Ni) layer 17 is formed on the surface of the electrode pad 13 with this zinc (Zn) layer 16 as the catalyst.

As a result, the bump electrode 22 is provided above the surface of the electrode pad 13 with the nickel (Ni) layer 17 having a uniform thickness therebetween, which certainly prevents the solder component constituting the bump electrode 22 from being diffused into the electrode pad 13.

Moreover, owing to the existence of the copper (Cu) diffusion region 15a deposited in the form of discontinuous spots or islands, the adhesion of the nickel (Ni) layer 17 to the electrode pad 13 significantly improves. Consequently, the bump electrode 22 is formed with strong adhesion to the electrode pad 13, and high reliability is ensured.

As described above, according to this embodiment, even where, using the electrode pad made of aluminum-silicon (Al—Si) or the like, the bump electrode is provided thereon, the copper (Cu) diffusion region formed in the form of discontinuous spots or islands is provided in the surface layer portion of the electrode pad, which makes it possible to ensure the sufficient adhesion of the bump electrode and obtain the bump electrode stably connected to the electrode pad, thereby enabling the realization of a highly reliable semiconductor device.

Third Embodiment

A third embodiment of the present invention will be described below.

Similarly to the above embodiments, this embodiment discloses a semiconductor device constructed by connecting the electrode pad and the bump electrode via the nickel (Ni) layer and a manufacturing method thereof, but differs from the above embodiments in a formation state of a copper (Cu) film and a diffusion form of copper.

The manufacturing method of the semiconductor device in the third embodiment will be shown in FIG. 7A to FIG. 7G, FIG. 8A to FIG. 8F, and FIG. 9A to FIG. 9C.

Incidentally, the same numerals and symbols will be used to designate components corresponding to those in the above first and second embodiments, and a detailed description of the same steps will be omitted.

Figure 7A:
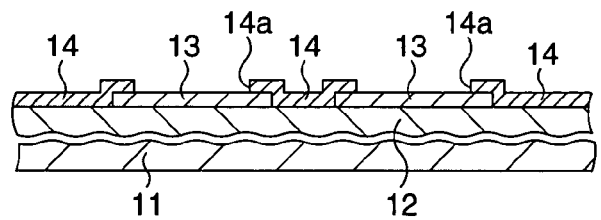
FIG. 7A to FIG. 7G are schematic sectional views showing a manufacturing method of a semiconductor device according to a third embodiment of the present invention step by step.

First, as shown in FIG. 7A, the same step as shown in FIG. 1A in the above first embodiment is performed.

Figure 7B:
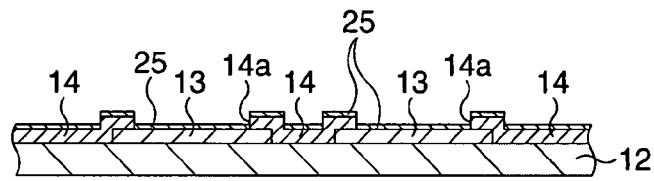

Then, a copper (Cu) layer 25 is formed on the surface of the electrode pad 13 (see FIG. 7B).

Namely, copper (Cu) is deposited on the entire surface including the surface of the electrode pad 13 exposed from the opening 14a of the passivation layer 14 by the sputtering method or the vapor deposition method, thereby forming the copper (Cu) layer 25.

At this time, the thickness of the copper (Cu) layer 25 is about 50 nm which is thicker than the thickness of the copper (Cu) layer 15 in the second embodiment.

Incidentally, in this embodiment, in and after FIG. 7B, a graphic representation of the semiconductor substrate 11 will be omitted.

Figure 7C:
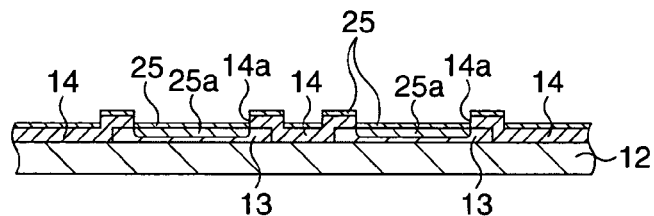

Then, the semiconductor substrate 11 is heat-treated in the state where the copper (Cu) layer 25 is formed on the surface of the electrode pad 13 exposed from the opening 14a of the passivation layer 14 (see FIG. 7C).

This heat treatment is performed under conditions of, for example, 300° C. and three minutes in a vacuum atmosphere.

Figure 9A:
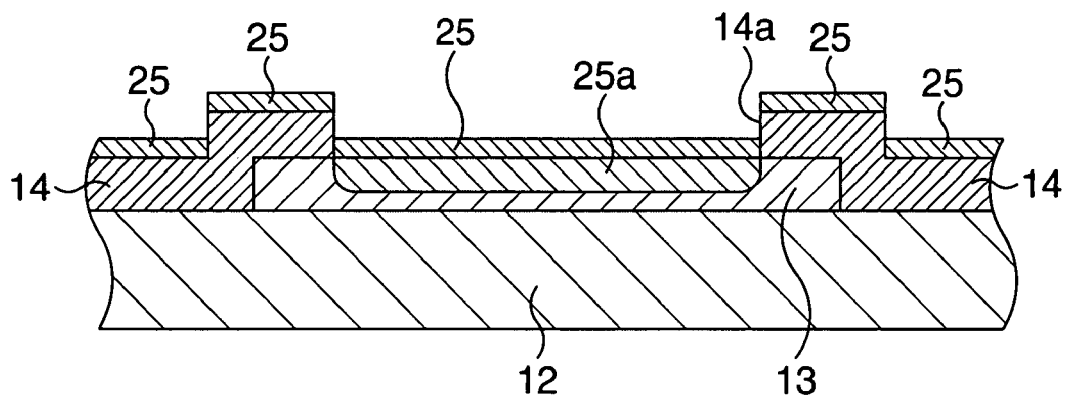
FIG. 9A to FIG. 9C are schematic sectional views showing specific steps of the manufacturing method of the semiconductor device according to the third embodiment in an enlarged form.

As a result of this heat treatment, as shown in FIG. 9A, copper (Cu) of the copper (Cu) layer 25 is thermally diffused into the surface layer of the electrode pad 13, thereby forming a copper (Cu) diffusion region 25a having a concentration ingredient in which the concentration becomes lower as the depth becomes deeper from the surface thereof in the electrode pad 13 (FIG. 9A shows the electrode pad 13 portion in FIG. 7C in an enlarged form).

Here, the copper (Cu) diffusion region 25a is formed continuously with a uniform thickness, so that compared to the copper (Cu) diffusion region 15a in the above second embodiment, it is formed with a more uniform concentration distribution at a plane surface of the surface layer portion of the electrode pad 13 and a concentration gradient in which the concentration becomes lower as the depth becomes deeper from the surface in the thickness direction of the electrode pad 13.

Figure 7D:
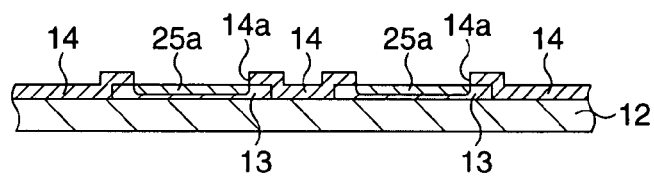

Then, the copper (Cu) layer 25 is removed (see FIG. 7D).

Namely, portions remaining on the surface of the electrode pad 13 exposed in the opening 14a, that is, unreacted copper (Cu) which is not diffused into the electrode pad 13 by the above heat treatment and copper (Cu) existing on the passivation layer 14 around the opening 14a are removed by the wet etching method.

This wet etching is performed by immersing the semiconductor substrate 11 in an etching solution, for example, containing a hydrogen peroxide solution as a main component.

As a result, the copper (Cu) layer 25 does not remain on the surface of the electrode pad 13, and the surface layer portion of the electrode pad 13 is turned into the state of an aluminum-silicon (Al—Si) alloy containing the diffused copper (Cu).

Figure 7E:
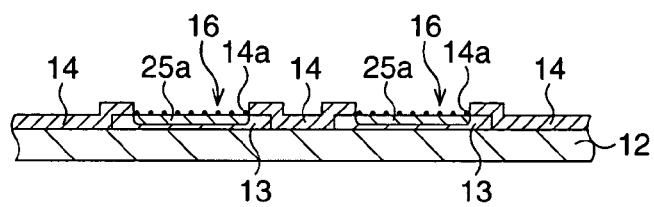

Then, zinc (Zn) is precipitated on the surface of the electrode pad 13, thereby forming the zinc (Zn) layer 16 (see FIG. 7E).

As described above, by using the double zincate method with the plating bath containing zinc (Zn) and immersing the semiconductor substrate 11 in the electroless plating bath, the zinc (Zn) layer 16 is deposited/formed on the surface of the electrode pad 13 exposed in the opening 14a of the passivation layer 14 and having the copper (Cu) diffusion region 25a in its surface layer portion.

The zinc (Zn) layer 16 acts as a catalyst in electroless plating of nickel (Ni) described later.

Here, the surface of the electrode pad 13 is turned into the state of the aluminum-silicon (Al—Si) alloy containing copper (Cu) as described above.

Figure 9B:
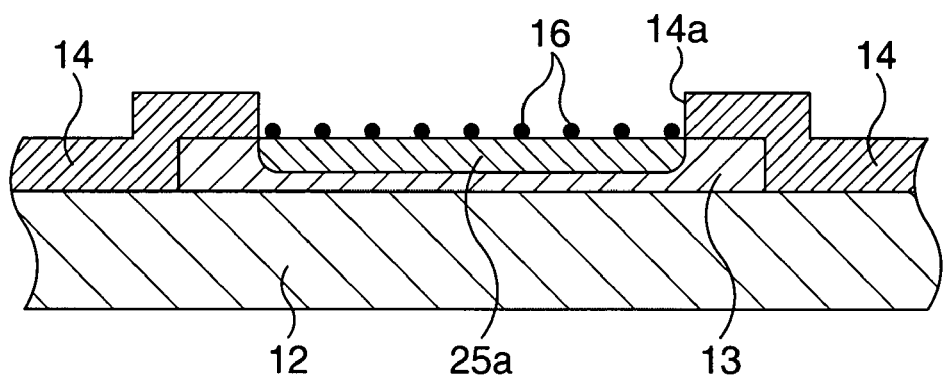

Accordingly, as shown in FIG. 9B, zinc (Zn) is deposited/formed in a nearly uniform distribution state over the entire region of the exposed surface of the electrode pad 13 (FIG. 9B shows the electrode pad 13 portion shown in FIG. 7E in an enlarged form).

Figure 7F:
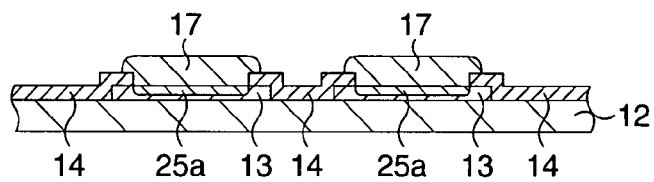
Figure 7G:
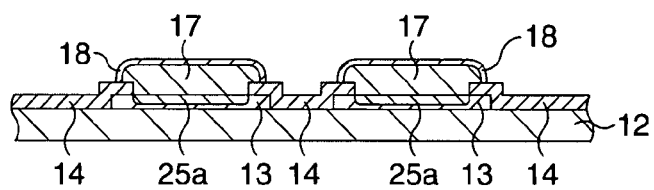
Figure 8A:
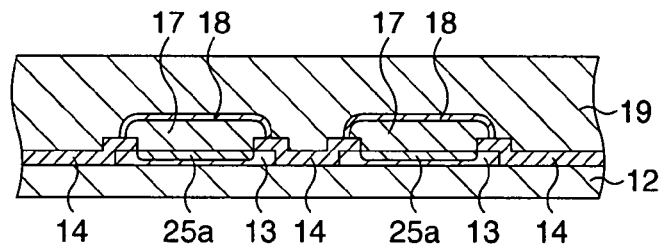
FIG. 8A to FIG. 8F are schematic sectional views showing the manufacturing method of the semiconductor device according to the third embodiment of the present invention step by step.
Figure 8B:
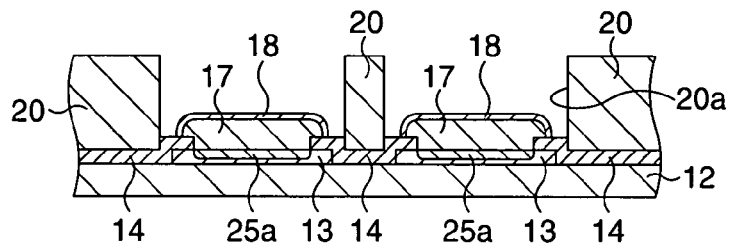
Figure 8C:
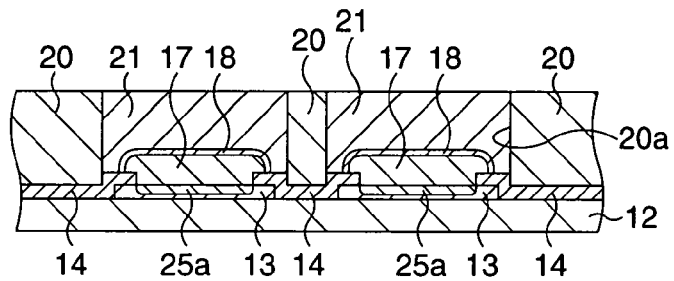
Figure 8D:
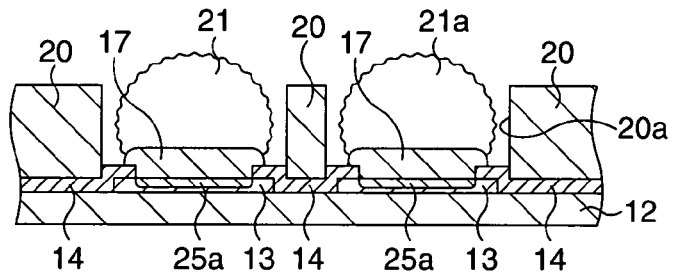
Figure 8E:
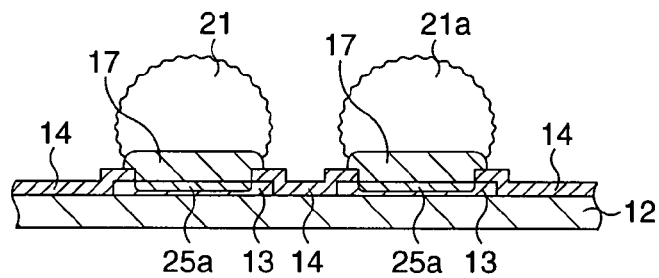
Figure 8F:
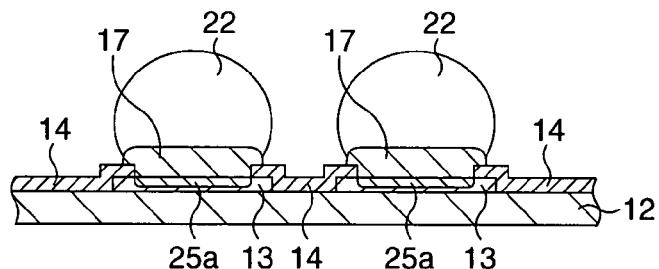

Then, the nickel (Ni) layer 17 is formed on the electrode pad 13 by the electroless plating method using the zinc (Zn) layer 16 as a catalyst (see FIG. 7F).

The plating of nickel (Ni) is performed by using the electroless plating bath containing phosphorus (P) and boron (B) together with the nickel (Ni) and immersing the semiconductor substrate 11 in the plating bath.

In this electroless plating, the zinc (Zn) layer 16 acts as a catalyst, and nickel (Ni) is precipitated on the surface of the electrode pad 13 exposed in the opening 14a of the passivation layer 14, thereby forming the nickel (Ni) layer 17.

Namely, nickel (Ni) is substituted for zinc (Zn) as the catalyst and precipitated to thereby form the nickel (Ni) layer 17.

Figure 9C:
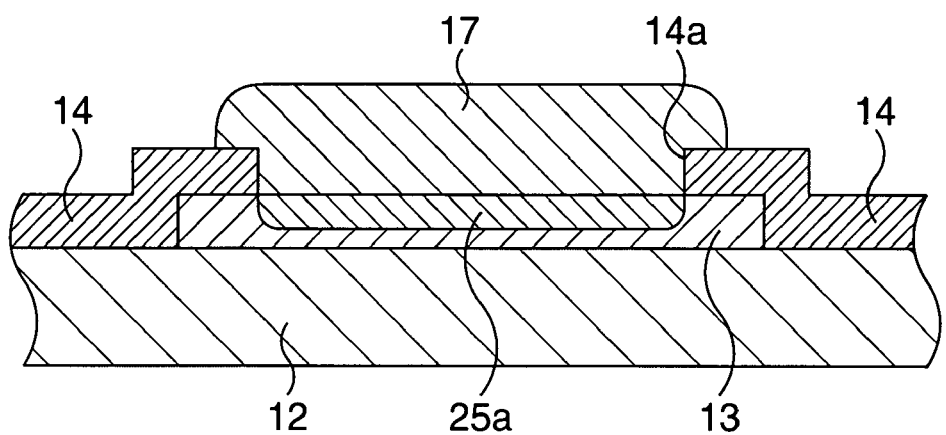
Figure 10A:
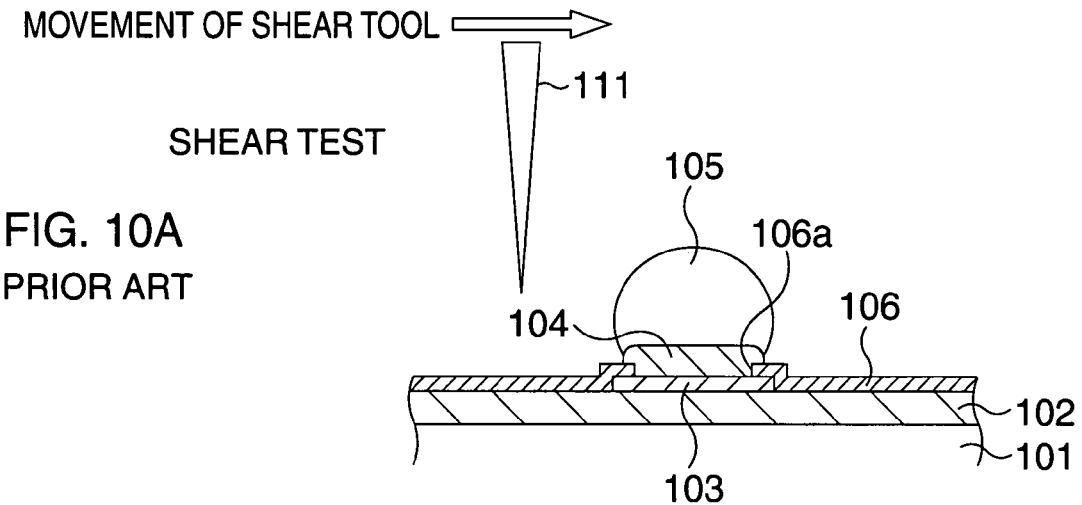
FIG. 10A to FIG. 10C are schematic sectional views for explaining a problem of a conventional semiconductor device.
Figure 10B:
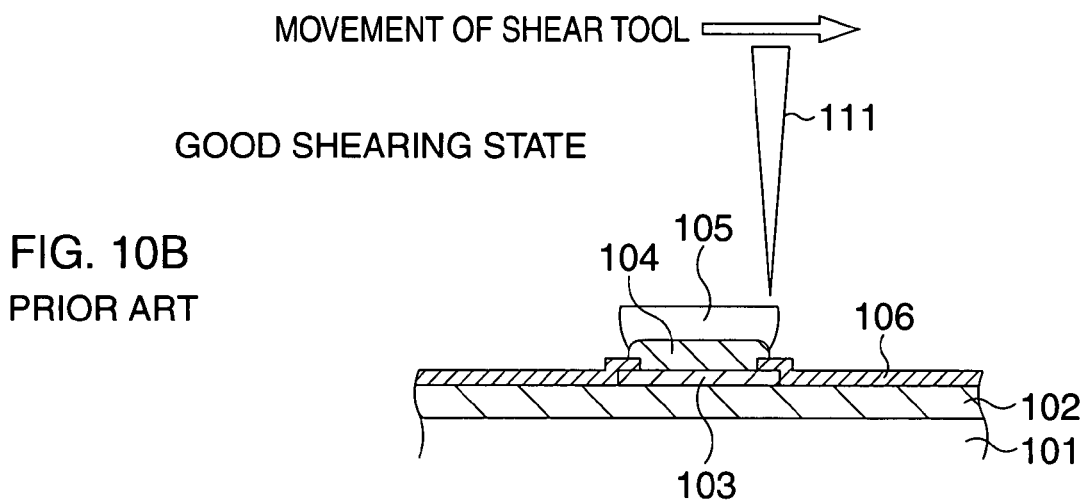
Figure 10C:
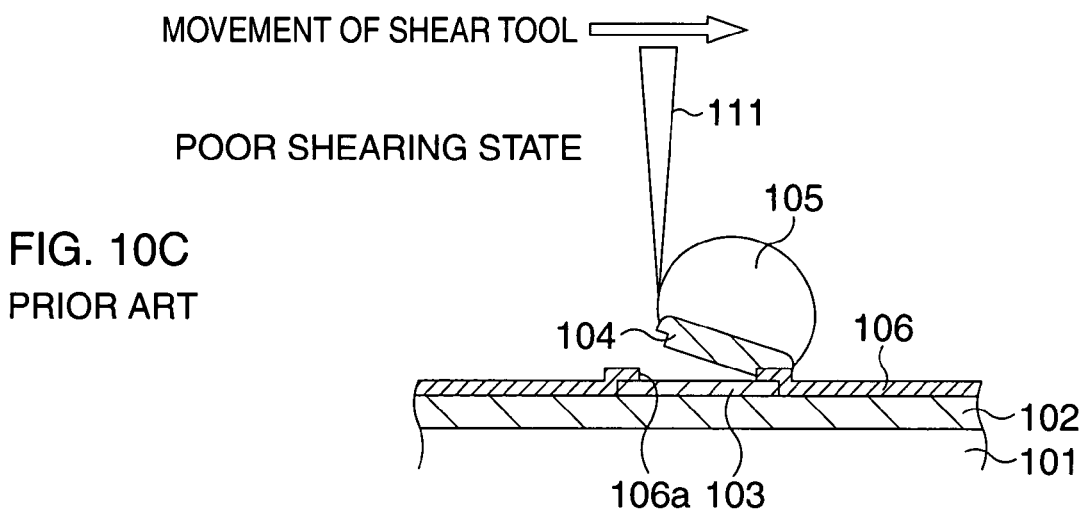
Figure 11A:
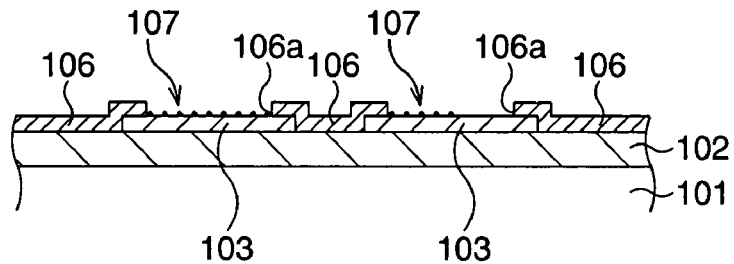
FIG. 11A to FIG. 11C are schematic sectional views showing steps of a manufacturing method of the conventional semiconductor device.
Figure 11B:
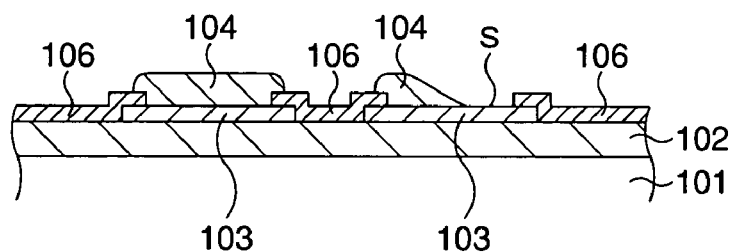
Figure 11C:
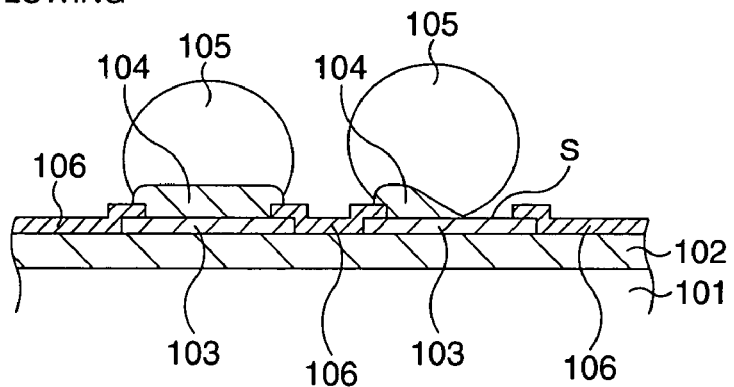

As a result, as shown in FIG. 9C, on the surface of the electrode pad 13 exposed in the opening 14a, the nickel (Ni) layer 17 is formed (FIG. 9C shows the electrode pad 13 portion shown in FIG. 7F in an enlarged form).

In this embodiment just described, thanks to the planar uniformity at the surface of the copper (Cu) diffusion region 25a formed in the entire region of the exposed surface of the electrode pad 13, the adhesion of the nickel (Ni) layer 17 to the electrode pad 13 significantly improves.

The nickel (Ni) layer 17 functions as a barrier metal against a solder component of the bump electrode described later, and its thickness is a thickness equal to or thicker than a thickness capable of preventing the solder component from being diffused into the electrode pad 13, for example, a thickness of 3 µm to 10 µm.

Incidentally, also here a case where with the formation of the nickel (Ni) layer 17, the zinc (Zn) layer 16 disappears from the top of the electrode pad 13 is shown, but the zinc (Zn) layer 16 may remain on the electrode pad 13 while significantly being thinned without disappearing.

Then, as shown in FIG. 7G and FIG. 8A to FIG. 8F, the same steps as shown in FIG. 1F and FIG. 2A to FIG. 2F in the above first embodiment are performed sequentially, and a semiconductor device is formed by forming the nickel (Ni) layer 17 on the surface of the electrode pad 13 in the state where the copper (Cu) diffusion region 25a is formed in the surface layer of the electrode pad 13 exposed in the opening 14a and providing the bump electrode 22 on the nickel (Ni) layer 17.

In this embodiment, in the state where the copper (Cu) diffusion region 25a is formed in the almost entire region of the surface layer of the electrode pad 13 exposed from the opening 14a, the nickel (Ni) layer 17 is formed on the surface of the electrode pad 13.

By this constitution, the zinc (Zn) layer 16 precipitated with a nearly uniform distribution is formed on the surface of the electrode pad 13. Then, the nickel (Ni) layer 17 is formed with a uniform thickness on the surface of the electrode pad 13 with this zinc (Zn) layer 16 as a catalyst.

As a result, the diffusion of the solder component constituting the bump electrode 22 provided above the surface of the electrode pad 13 with the nickel (Ni) layer 17 therebetween into the electrode pad 13 is certainly prevented.

Moreover, owing to the existence of the copper (Cu) diffusion region 25a in the electrode pad 13, the adhesion of the nickel (Ni) layer 17 to the electrode pad 13 significantly improves. Consequently, the bump electrode 22 is provided in a more stable state with high adhesion to the electrode pad 13, and high reliability is ensured.

As described above, according to this embodiment, even where, using the electrode pad made of aluminum-silicon (Al—Si) or the like, the bump electrode is provided thereon, the copper (Cu) diffusion region is provided in the almost entire region of the surface layer portion of the electrode pad, which makes it possible to ensure the sufficient adhesion of the bump electrode and obtain the bump electrode stably connected to the electrode pad, thereby enabling the realization of a highly reliable semiconductor device.

According to the present invention, it is possible to realize a highly reliable semiconductor device by a structure in which when a bump electrode is provided above an electrode pad not containing copper (Cu), for example, made of aluminum-silicon (Al—Si) with a foundation layer made of nickel (Ni) therebetween, the bump electrode is provided with the high adhesion to the electrode pad with the foundation layer therebetween, and by the above bump electrode forming steps.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
    a semiconductor substrate;
    an electrode pad provided above one principal surface of said semiconductor substrate, using aluminum as its main material, and having a copper layer on its surface layer portion;
    a bump foundation layer provided on said electrode pad; and
    a bump provided above said electrode pad with said bump foundation layer therebetween;
    wherein the copper layer is a layer having a form of discontinuous spots or islands.

2. The semiconductor device according to claim 1, wherein said bump foundation layer is formed of a nickel layer.

3. The semiconductor device according to claim 1, wherein said copper (Cu) layer is formed with a thickness of 1 nm or more and 20 nm or less.

4. The semiconductor device according to claim 1, wherein said electrode pad is provided on an insulating layer provided on the one principal surface of said semiconductor substrate.

* * * * *